(12) United States Patent
Ono

(10) Patent No.: US 7,230,607 B2
(45) Date of Patent: Jun. 12, 2007

(54) 6-KEY KEYBOARD FOR TOUCH TYPING

(76) Inventor: Katsuyasu Ono, 3-40-1-1005, Maehara-cho, Koganei-shi, Tokyo 184-0013 (JP)

( * ) Notice: Subject to any disclaimer, the term of this patent is extended or adjusted under 35 U.S.C. 154(b) by 192 days.

(21) Appl. No.: 11/008,673

(22) Filed: Dec. 10, 2004

(65) Prior Publication Data
US 2005/0099397 A1 May 12, 2005

(51) Int. Cl.
*G09G 5/00* (2006.01)

(52) U.S. Cl. .................. 345/172; 345/173; 345/169

(58) Field of Classification Search ............... 345/172, 345/173, 169, 156, 168
See application file for complete search history.

(56) References Cited

U.S. PATENT DOCUMENTS

| 6,271,835 B1 * | 8/2001 | Hoeksma | 345/168 |
| 7,113,172 B2 * | 9/2006 | Hohl et al. | 345/169 |

FOREIGN PATENT DOCUMENTS

| JP | 58-058634 | 4/1983 |
| JP | 60-231253 | 11/1985 |
| JP | 07-200120 | 8/1995 |
| JP | 2002-215302 | 8/2002 |
| JP | 2002-236538 | 8/2002 |

OTHER PUBLICATIONS

English Abstract of JP Application No. 2001-006954, Publication No. 2002-215302, Aug. 2, 2002, Patent Abstracts of Japan, Japanese Patent Office Website.
English Abstract of JP Application No. 56-156443, Publication No. 58-058634, Apr. 7, 1983, Patent Abstracts of Japan, Japanese Patent Office.
English Abstract of JP Application No. 05-355185, Publication No. 07-200120, Aug. 4, 1995, Patent Abstracts of Japan, Japanese Patent Office Website.
English Abstract of JP Application No. 59-087264, Publication No. 60-231253, Nov. 16, 1985, Patent Abstracts of Japan, Japanese Patent Office Website.
English Translation of International Preliminary Examination Report Issued for PCT/JP2003/007482, Jul. 7, 2005, 4 pages.
Patent Abstract of Japan, Publication No. 2002-236538, Aug. 23, 2002, JP Patent Application No. 2001-077262, Kobayashi Koji, Japan Patent Office.

* cited by examiner

*Primary Examiner*—Amr A. Awad
*Assistant Examiner*—Seokyun Moon

(57) ABSTRACT

A keyboard having six keys. Characters are entered in two strokes. That is, the user selects a group including a desired character by the first stroke, and selects the desired character by the second stroke. On the key top, each key has legends of characters corresponding to key layout so that it is intuitively recognizable which keys the respective characters are assigned to after the group is selected. By means of such a keyboard, characters can be entered with the fewer keys. This facilitates key entry by touch typing.

8 Claims, 10 Drawing Sheets

FIG.2

| NUMBER OF KEYS | 27 (1) | 3 (5) | 6 (4) | 9 (3) |
|---|---|---|---|---|
| FACILITY OF TOUCH TYPING | QUICK (5) | SOMEWHAT SLOW (2) | QUICK (5) | SOMEWHAT QUICK (4) |
| MEMORABILITY | AVERAGE (3) | HARD (1) | EASY (5) | AVERAGE (3) |
| SIMPLICITY OF NOTATION | AVERAGE (3) | COMPLICATED (1) | SIMPLE (5) | SOMEWHAT SIMPLE (4) |
| NUMBER OF KEY STROKES PER CHARACTER | 1 (5) | 3 (1) | 2 (4) | 2 (4) |
| OPERATION LEARNABILITY | POOR (2) | HARD (1) | EASY (4) | SOMEWHAT EASY (3) |
| OPERABILITY WITH MOUSE | TWO-HANDED (1) | SINGLE-HANDED (5) | SINGLE-HANDED (5) | SINGLE-HANDED (5) |
| TOTAL SCORE | 20 | 16 | 32 | 26 |

FIG.5

| FIRST BUFFER | 101 code | 102 code | 103 code | 104 code | 105 code | 106 code |
|---|---|---|---|---|---|---|
| 101 code | A | B | case 1 | H | I | case 2 |
| 102 code | C | D | E | J | K | L |
| 103 code | BackSpace | F | G | case 4 | M | N |
| 104 code | O | P | case 5 | V | W | case 6 |
| 105 code | Q | R | S | X | Y | Z |
| 106 code | case 7 | T | U | case 8 (TSK) | Space | Shift |

SECOND BUFFER

FIG.6

| EXTENDED KEY | 101 code | 102 code | 103 code | 104 code | 105 code | 106 code |
|---|---|---|---|---|---|---|
| | | | THIRD KEY CODE | | | |
| case 1: | Enter | ! | " | # | $ | % |
| case 2: | Caps | & | ' | ( | ) | * |
| case 4: | + | . | \| | . | / | .. |
| case 5: | ; | ∨ | = | ∧ | ? | @ |
| case 6: | [ | ¥ | ] | - | - | ` |
| case 7: | { | \| | } | ~ | Tab-> | <-Tab |

FIG.7

| KEY SEQUENCE | CHARACTER CODE |
|---|---|
| 101. 101 | A |
| 101. 102 | B |
| 101. 104 | H |
| 101. 105 | I |
| 102. 101 | C |
| 102. 102. | D |
| 102. 103. | E |
| 102. 104. | J |
| 102. 105. | K |
| 102. 106 | L |
| 101. 103. 101. | Enter |
| 101. 103. 102. | ! |
| 101. 103. 103. | " |
| 101. 103. 104. | # |
| 101. 103. 105. | $ |
| 101. 103. 106. | % |
| 106. 101. 101. | { |
| 106. 101. 102. | \| |
| 106. 101. 103. | } |
| 106. 101. 104. | ~ |
| 106. 101. 105. | Tab-> |
| 106. 101. 106. | <-Tab |
| 106. 104. 102. 103. 105. 104. (TSK+ex) | ! |
| 106. 104. 102. 102. 105. 101. (TSK+dq) | " |
| ⋮ | ⋮ |

FIG.10

| SPECIAL CHARACTER | KEY SEQUENCE | SPECIAL CHARACTER | KEY SEQUENCE | SPECIAL CHARACTER | KEY SEQUENCE |
|---|---|---|---|---|---|
| ! | TSK+ex | " | TSK+dq | # | TSK+sh |
| $ | TSK+dl | % | TSK+pc | & | TSK+am |
| . | TSK+qo | ( | TSK+lp | ) | TSK+rp |
| * | TSK+as | + | TSK+pl | , | TSK+cm |
| - | TSK+mn | . | TSK+dt | / | TSK+sl |
| 0 | TSK+ze | 1 | TSK+on | 2 | TSK+tw |
| 3 | TSK+th | 4 | TSK+fo | 5 | TSK+fi |
| 6 | TSK+si | 7 | TSK+se | 8 | TSK+ei |
| 9 | TSK+ni | : | TSK+cl | ; | TSK+sc |
| < | TSK+lt | = | TSK+eq | > | TSK+gt |
| ? | TSK+qe | @ | TSK+at | [ | TSK+lb |
| ¥ | TSK+bs | ] | TSK+rb | ^ | TSK+ht |
| _ | TSK+ub | ` | TSK+rq | { | TSK+lr |
| \| | TSK+pp | } | TSK+rr | ~ | TSK+cd |

FIG.11

| SPECIAL KEY | KEY SEQUENCE | SPECIAL KEY | KEY SEQUENCE | SPECIAL KEY | KEY SEQUENCE |
|---|---|---|---|---|---|
| Ctrl | TSK+ct | Esc | TSK+ec | Alt | TSK+al |
| Ins | TSK+in | Del | TSK+de | Tab-> | TSK+tb |
| <-Tab | TSK+bt | Home | TSK+hm | End | TSK+en |
| PgUp | TSK+pu | PgDn | TSK+pd | ↓ | TSK+la |
| ↑ | TSK+ua | → | TSK+ra | ↵ | TSK+da |
| Break | TSK+br | SysRq | TSK+sy | PrtScr | TSK+pr |
| ScrLock | TSK+sk | Pause | TSK+pa | NumLock | TSK+nl |
| F1 | TSK+fa | F2 | TSK+ft | F3 | TSK+fh |
| F4 | TSK+ff | F5 | TSK+fv | F6 | TSK+fx |
| F7 | TSK+fs | F8 | TSK+fe | F9 | TSK+fn |
| F10 | TSK+fj | F11 | TSK+fl | F12 | TSK+fw |
| NoConvt | TSK+nc | Convt | TSK+cv | Kana | TSK+kn |
| Shift | TSK+st | Caps | TSK+cp | Kanji | TSK+kj |
| Windows1 | TSK+wi | Windows2 | TSK+wn | | |
| BackSpace | TSK+bk | | | | |
| Ctrl+Alt+Del | TSK+ca | | | | |

6-KEY KEYBOARD FOR TOUCH TYPING

BACKGROUND OF THE INVENTION

1. Field of the Invention

The invention relates to a character input technology, and more particularly to a technology for entering characters by using a keyboard.

2. Description of the Related Art

Among input devices for issuing predetermined instructions to a computer is a keyboard. In general, a keyboard has a plurality of keys, and a single character is assigned to each of the keys. Such a keyboard is considered to be a direct extension of a typewriter, having at least 26 keys to enter 26 alphabetical characters, for example. When a single character is thus assigned to each single key, the large number of keys makes it difficult to remember the key layout. Touch typing has thus required considerable time to learn. Moreover, the keyboard is large in size and inconvenient to carry. In view of this, there have been proposed keyboards which allow character input with fewer keys (Japanese Patent Laid-Open Publications Nos. Hei 7-200120 and Sho 60-231253).

Recently, with the development of network technologies, the numbers of users who, for example, use emails and access websites are increasing sharply. Even for users who have had nothing to do with keyboards so far, the chances to use keyboards to enter characters are on the increase accordingly. In addition, using a keyboard becomes increasingly inevitable in information society, and there are growing needs for input means that are friendly to all people.

SUMMARY OF THE INVENTION

The present invention has been achieved in view of the foregoing. It is thus an object of the present invention to provide a technology for allowing efficient character input from a keyboard having fewer keys.

One of the aspects of the present invention is an input device. This device comprises: six keys; and a control unit which outputs predetermined character codes when the six keys are pressed. The control unit realizes: dividing a predetermined character set into no more than six groups each including six characters or less, and assigning each of the groups to one of the six keys; after a key to which any one of the groups is assigned is pressed, assigning each of the characters included in the group assigned to the pressed key to one of the keys; and when a key to which any one of the characters is assigned is pressed, outputting a character code of the character. Consequently, characters can be entered by using the six keys. The "predetermined character set " may be a set of characters to be used in a predetermined language, such as alphabetical characters and Korean characters.

Any of the keys provided on the input device may have legends of the characters included in a group under a predetermined rule, so as to show visually which keys the respective characters included in the group are assigned to after the group is selected. The legends of the characters included in the group may replicate a layout of those keys. The "predetermined rule" is a notational rule by which it is possible to identify which keys the respective characters are assigned to from the written character string. For example, the legends may replicate the key layout. Alternatively, the characters included in a group may be written in a single string, where the left end to the right end of the string correspond to the left end to the right end of the upper keys plus the left end to the right end of the lower keys.

The six keys provided on the input device may be arranged in two rows and three columns.

Another aspect of the present invention is also an input device. This device comprises: an input unit which accepts six types of first identification information respectively assigned to six keys arranged in two rows and three columns; a storing unit which retains combinations of the first identification information, and associated pieces of second identification information for identifying predetermined characters; a control unit which retrieves a piece of the second identification information corresponding to the combination of the first identification information accepted by the input unit, from the storing unit with the combination of the first identification information accepted by the input unit as a search key; and an output unit which outputs the piece of second identification information retrieved.

The input unit may convert a character code accepted from an external keyboard into the first identification information.

Still another aspect of the present invention is an input device. This device comprises: a plurality of keys; and a control unit which outputs predetermined character codes when the keys are pressed. The control unit realizes: dividing a predetermined character set into a plurality of groups each including no more than a predetermined number of characters, and assigning each of the groups to one of the plurality of keys; after a key to which any one of the groups is assigned is pressed, assigning each of the characters included in the group assigned to the pressed key to one of the keys; and when a key to which any one of the characters is assigned is pressed, outputting a character code of the character.

The predetermined number may be less than or equal to the number of keys provided on the input device.

Incidentally, any combinations of the foregoing components, and the expressions of the present invention converted among methods, apparatuses, systems, recording media, computer programs, and the like are also intended to constitute applicable aspects of the present invention.

BRIEF DESCRIPTION OF THE DRAWINGS

The foregoing object and other objects, features, and advantages of the invention will become more apparent from the following description of a preferred embodiment when read in conjunction with the accompanying drawings, in which:

FIG. 2 is a chart for showing the result of a survey, in which alphabetical characters were entered from a variety of keyboards;

FIG. 5 is a chart for showing an example of a table for identifying characters based on the key codes retained in the first buffer and the second buffer;

FIG. 6 is a chart for showing an example of a table for the control unit to consult in selecting characters to be identified by third key depression;

FIG. 7 is a chart for showing an example of a hash table which defines the key sequences for respective input characters;

FIG. 10 is a chart for showing an example of key sequences for entering special characters; and FIG. 11 is a chart for showing an example of key sequences for entering special keys.

DETAILED DESCRIPTION OF THE PREFERRED EMBODIMENT

Figure 1A:
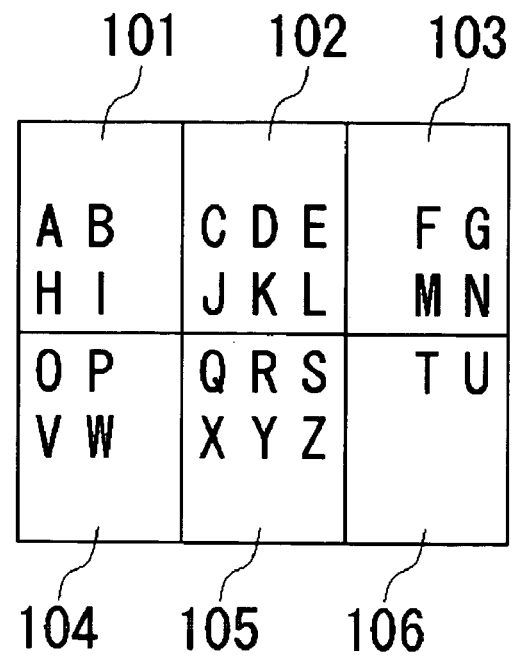
FIG. 1A is a diagram showing the key top of a keyboard according to the embodiment.

FIG. 1A is a diagram showing the key top of a keyboard 100 according to an embodiment. The keyboard 100 according to the present embodiment has a total of six keys, or a first key 101, a second key 102, a third key 103, a fourth key 104, a fifth key 105, and a sixth key 106, which are arranged in two horizontal rows and three vertical columns. The individual keys may be aligned into a lattice layout, or arranged well conforming to the orbits of movement of fingers. In either case, the keys are preferably arranged so that they can be pressed with three fingers, or the forefinger, the middle finger, and the ring finger, comfortably. One can move these three fingers freely as compared to the thumb and the little finger. Then, in view of the number and arrangement of keys capable of being pressed with these three fingers with the wrist fixed roughly, the keyboard 100 of the present embodiment adopts the two-row three-column key layout.

FIG. 2 is a chart for showing the result of a survey, in which alphabetical characters were entered from a variety of keyboards. Based on the result of this survey, the inventor has worked out the number of keys appropriate for touch typing. The subjects of this survey ranged from elementary school age to old age. The subjects operated 27-key, 3-key, 6-key, and 9-key keyboards, and evaluated them on a scale of 1 to 5 on "the number of keys," "facility of touch typing," "memorability," "simplicity of notation," "the number of key strokes per character," "operation learnability," and "operability with a mouse." FIG. 2 summarizes respective averages and total scores.

The "memorability" refers to the ease of memorizing characters assigned to each key. The "simplicity of notation" refers to the viewability of characters assigned to each key. "The number of key strokes per character" refers to the number of key strokes necessary to enter a desired character. Generally speaking, characters can be entered even with a single key. For example, the duration of contact of a key can be distinguished between long and short to constitute Morse code, which allows entry of any character. Excluding temporal factors, any character can be input with two keys. The methods thereof are broadly classified into an N-touch system and an extended key system. In the N-touch system, assuming that a single character is to be determined by five touches, alphabetical characters can be entered by the two keys raised to the 5th power, i.e., by 32 keys. Meanwhile, in the extended key system, assume that R is an extended key and L is an end key. Then, possible key entries are L, RL, RRL, RRRL, . . . , RRR . . . RRRL, where a right key is R and a left key is L, for example. That is, the numbers of appearance of R can be associated with any characters. Most of the attempts to enter characters with fewer keys are combinations or modifications of these systems.

In general, the fewer the keys are, the greater the number of key strokes per character is. The "operation learnability" refers to the degree of ease or difficultly in learning touch typing. The keyboards were evaluated by investigating these factors generation by generation, with the result that the 6-key keyboard was the highest in total score. From the result of this survey, the inventor contemplated that a 6-key keyboard is appropriate for touch typing. This has led the inventor to the creation of the keyboard of FIG. 1A which is capable of alphabetical input with six keys.

In order to enable the input of all the alphabetical characters with the six keys, the keyboard 100 inputs a single character in two strokes. For two-stroke input, the alphabetical characters are divided into no more than six groups each including six characters or less. The groups are assigned to the respective keys. Then, a group is selected by the first key stroke. Once a group is selected, each of the characters included in the selected group is assigned to any one of the six keys. Then, the second key stroke selects the characters assigned to the respective keys.

Figure 1B:
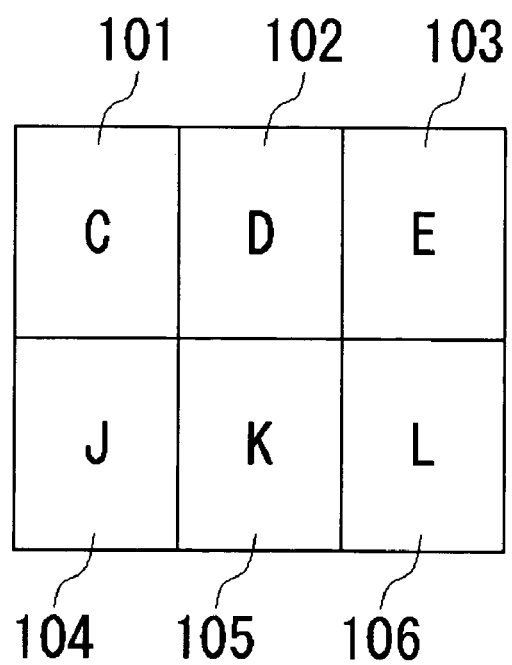
FIG. 1B is a diagram showing the state that characters of a second group are assigned to respective keys.

In FIG. 1A, a first group including "A, B, H, and I" is assigned to the first key 101. A second group including "C, D, E, J, K, and L" is assigned to the second key 102. Similarly, the groups including "F, G, M, and N," "O, P, V, and W," "Q, R, S, X, Y, and Z," and "T and U" are assigned to the third key 103, the fourth key 104, the fifth key 105, and the sixth key 106, respectively. For example, to enter "J," the user initially presses the second key 102 to which the second group is assigned, and then presses the fourth key 104. In terms of internal processing, when the second key 102 is pressed, the second group "C, D, E, J, K, and L" is selected. As shown in FIG. 1B, the characters of the second group are then assigned to the respective keys. More specifically, "C" is assigned to the first key 101 on the left of the second key 102. "D" is assigned to the second key 102. "E" is assigned to the third key 103 on the right of the second key 102. "J" is assigned to the fourth key 104 on the lower left of the second key 102. "K" is assigned to the fifth key 105 beneath the second key 102. "L" is assigned to the sixth key 106 on the lower right of the second key 102. When the user presses the fourth key 104, "J" assigned to the fourth key 104 is output.

Each key has legends of characters such that the user can intuitively recognize which characters are included in the group, and which keys the characters are assigned to after the group is selected. In FIG. 1A, the key layout of the keyboard 100 is replicated so that the characters to be entered by pressing the keys are shown at the corresponding positions. In FIG. 1A, the first key 101 and others whose groups include not as many as six characters are shown blanked in the areas corresponding to character-unassigned keys. This makes it possible for the user to recognize intuitively which keys must be pressed in order to enter a desired character. In another example, the legends need not include blanks. In this case, the characters are preferably assigned to the keys under a rule such that characters shown to the top left correspond to the first key 101.

Assigning the characters to the keys according to a certain rule can also facilitate memorizing the key layout and reduce the period for learning touch typing. More specifically, in FIG. 1A, the alphabetical characters are arranged in rows of seven, which are divided by two vertical lines and one horizontal line into the six groups each including up to six characters. In another example, "A, B, C, and D" may be assigned to the first key 101, "E, F, G, H, I, and J" to the second key 102, "K, L, M, and N" to the third key 103, "O, P, Q, and R" to the fourth key, "S, T, U, V, W, and X" to the fifth key, and "Y and Z" to the sixth key 106.

Characters that appear frequently may be assigned, by priority, to keys to be pressed with an easy-to-press finger out of the forefinger, the middle finger, and the ring finger. For example, since the forefinger is generally considered to be the easiest to press with, characters that appear frequently may be assigned to the first key 101 and the fourth key 104. Moreover, it is easier to move fingers alternately than to move an identical finger continuously. Thus, characters that appear frequently may be assigned as distributed over the first key 101, the fourth key 104, the second key 102, and the sixth key 106 which are to be pressed with the forefinger and the middle finger. In any case, the assignment of the characters is arbitrary, and may be set as appropriate according to such factors as the characteristics of the language to input, the frequencies of input of characters in the language, and the kinetic characteristics of the user.

Figure 3:
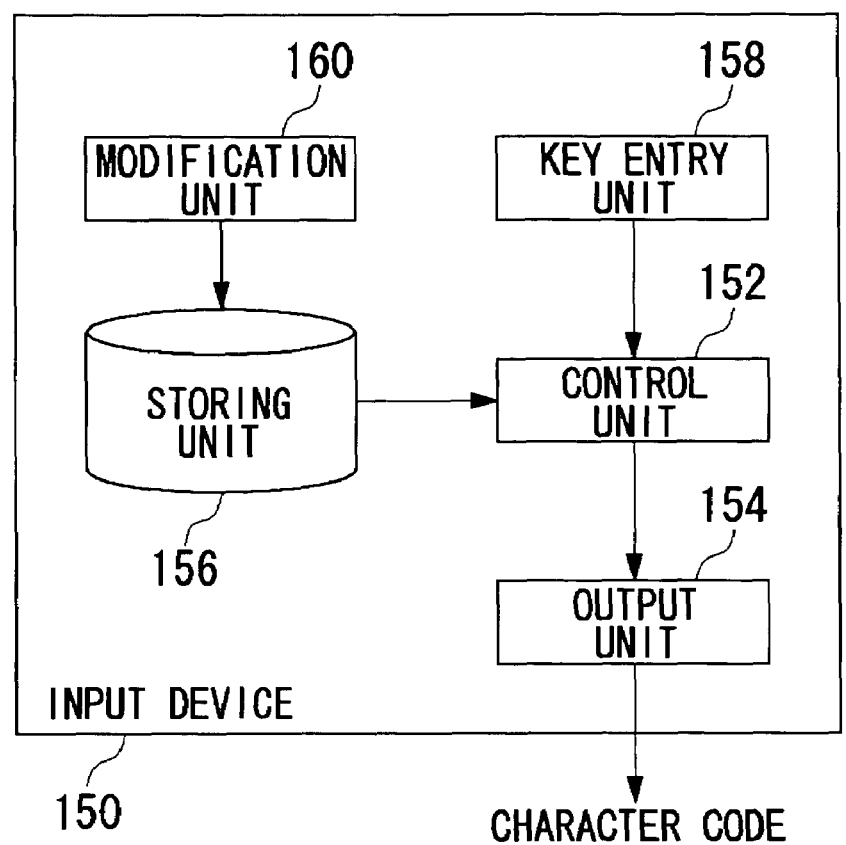
FIG. 3 is an internal block diagram of an input device which achieves the keyboard described in conjunction with FIGS. 1A and 1B.

FIG. 3 is an internal block diagram of an input device 150 for realizing the keyboard 100 described in conjunction with FIGS. 1A and 1B. In terms of hardware, the input device 150 consists chiefly of such members as a CPU, a memory, and a storage unit of an arbitrary computer. The storage unit, for example, is a hard disk which contains a program to be loaded on the memory to realize the components of FIG. 3. It will be understood by those skilled in the art, however, that various modifications may be made to the method and device for practice. It should be noted that the drawings to be seen below show functional blocks, not hardware configuration.

A key entry unit 158 is the keyboard 100 described in conjunction with FIGS. 1A and 1B. The key entry unit 158 may have moving keys, or nonmoving keys using a touch panel, a touch screen, or the like.

The key entry unit 158 outputs key codes assigned to pressed keys to a control unit 152. The "key codes" refer to identification information assigned to the keys, or information for identifying the six individual keys, for example. The control unit 152 performs processing for realizing the foregoing operation of the keyboard 100 based on the pressed keys. The processing for realizing the operation can be effected in various ways. For instance, the present embodiment will deal with a technique in which the keys pressed for the first time and the second time are retained temporarily, and a character is identified from the combination of the keys upon the second depression.

Figure 4:
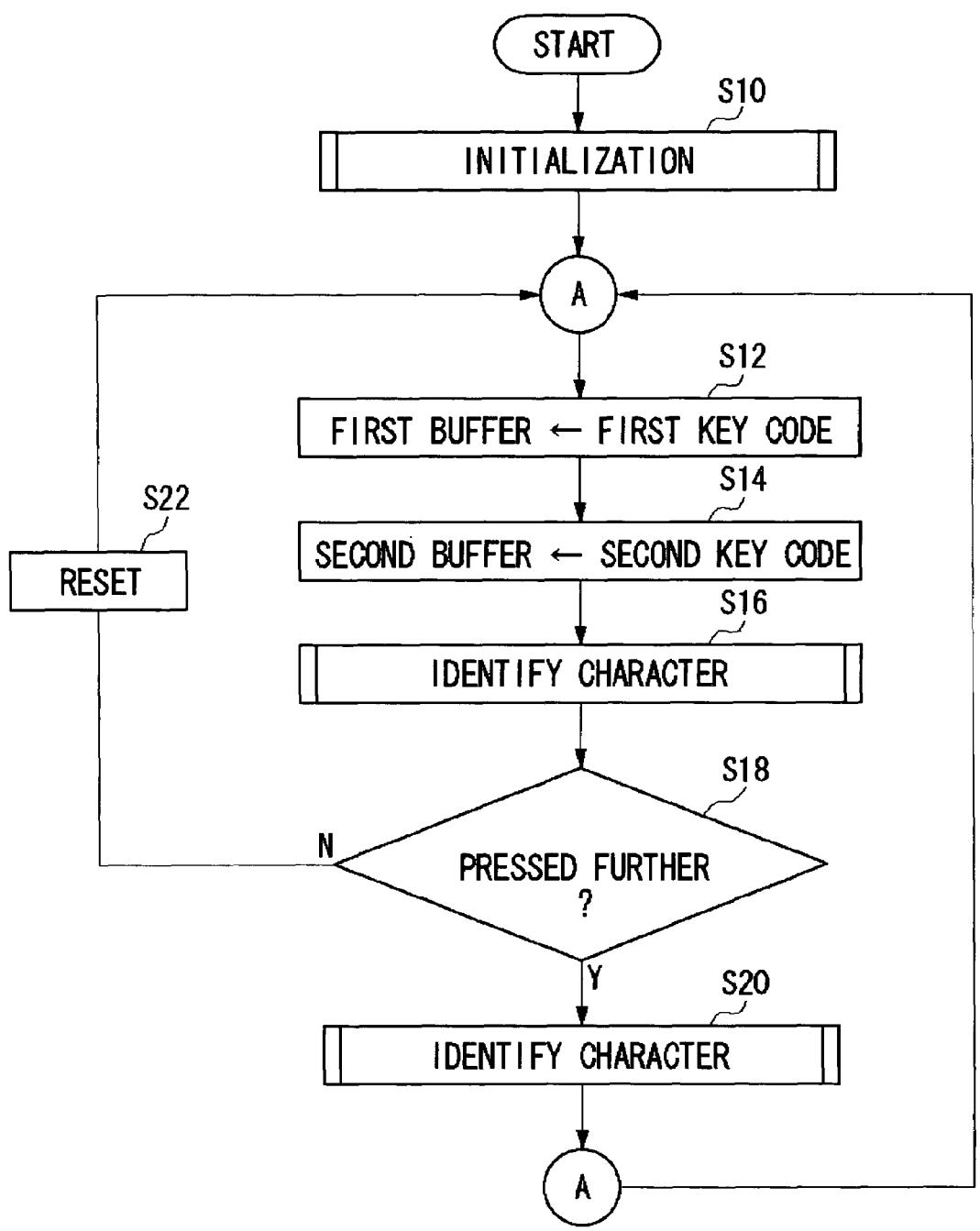
FIG. 4 is a flowchart for the processing of the control unit of FIG. 3.

FIG. 4 is a flowchart for the processing of the control unit 152. When the input device 150 is activated, the control unit 152 initially performs initialization on buffers and the like to be used in the subsequent stages of processing (S10). For example, the control unit 152 initializes a buffer for retaining the code of a key that is pressed for the first time (hereinafter, referred to simply as "first buffer") and a buffer for retaining the code of a key that is pressed for the second time (hereinafter, referred to simply as "second buffer"). When a key code for the first depression is supplied from the key entry unit 158, the control unit 152 stores it into the first buffer (S12). Next, when a key code for the second depression is supplied from the key entry unit 158, the control unit 152 stores it into the second buffer (S14). Subsequently, the control unit 152 identifies the character based on the combination of the key codes retained in the first buffer and the second buffer (S16).

FIG. 5 is a chart for showing an example of a table for identifying the characters based on the key codes retained in the first buffer and the second buffer. This table is stored in a storing unit 156 of FIG. 3. This table can be consulted to identify a character. For example, if the first buffer retains the key code of the first key 101 and the second buffer retains the key code of the second key 102, the control unit 152 selects the character "B." The control unit 152 outputs the character code of the character "B" through an output unit 154 of FIG. 3. Consequently, the alphabetical characters can be entered in two strokes.

For an ordinary keyboard, the 6-key keyboard 100 must be capable of entering a backspace, a break, a space, symbols, lowercases, etc. The character codes corresponding to these are thus assigned to the unoccupied areas. For example, a backspace can be entered by pressing the third key 103 and then the first key 101. The "case 1" to "case 8" represent respective extended keys. Some characters can be identified by pressing a key for the third time after an extended key. The "case 8," which is identified by pressing the sixth key 106 and then the fourth key 104, shall be defined as a "TSK (Two Stroke Key)." The expression "TSK+ex" shall mean that "TSK" is entered, followed by "E" and "X" in succession. In terms of key arrangement, it means that "the sixth key 106," "the fourth key 104," "the second key 102," "the third key 103," "the fifth key 105," and "the fourth key 104" are pressed in order.

FIG. 6 is a chart for showing a table for the control unit 152 to consult in selecting characters to be identified by third key depression. This table is stored in the storing unit 156 of FIG. 3. For example, "Enter" is input by pressing the first key 101, the third key 103, and the first key 101 in order. As above, the extended keys can be defined to increase the number of characters that can be entered with the six keys. This makes it possible, for example, to enter all the characters available from a full keyboard such as a 109 Japanese keyboard.

Returning to FIG. 4, the control unit 152 determines the presence or absence of a third key entry, based on whether an extended key is pressed or not (S18). In the absence of the third key depression (N at S18), the control unit 152 resets the first buffer and the second buffer (S22), and waits for key depression for the next character entry (A). In the presence of the third key depression (Y at S18), the control unit 152 waits for the third key code, and identifies the character code from the combination of the first, second, and third key codes (S20). In this way, many characters can be entered by associating unique sequences of key codes with respective characters to enter. This requires that the control unit 152, at S20, wait for a key code to be supplied from the key entry unit 158 until a series of key depression completes. This wait processing can be performed efficiently by using a hash table, for example. The use of a hash table allows efficient discrimination between applicable key sequences for character entry and inapplicable key sequences including typing errors.

FIG. 7 is a chart for showing an example of the hash table which defines the key sequences for the respective input characters. In the chart, "101" represents the key code of the first key 101, and "101, 102" indicates that the first key 101 is pressed and then the second key 102 is. For example, when an entry is made up to "TSK+e," the control unit 152 of FIG. 3 needs to determine whether or not to wait for the next key entry. Since "TSK+ex" is registered on the hash table of FIG. 7, the control unit 152 waits for the next key entry. If no sequence to follow "TSK+e" were registered, the control unit 152 would determine that it were an input error.

In this way, by using the hash table, the control unit 152 can efficiently determine whether or not to wait for the next key entry.

Returning to FIG. 3, a modification unit 160 modifies the contents of the tables stored in the storing unit 156. This allows the input device 150 to define the key sequences character by character according to user instructions. For example, the modification unit 160 may present a character to be modified on a display unit such as a monitor, and then register a user-typed key sequence onto the tables. New key sequences may also be registered by other methods. In another example, the modification unit 160 need not be provided.

The input device 150 may be formed on a predetermined computer by executing a program in the form of a keyboard driver. For example, when the input device 150 is formed inside the computer by means of a keyboard driver, the key entry unit 158 accepts character codes from a full keyboard, converts the same into the key codes of the first key 101 to the sixth key 106, and supplies the key codes to the control unit 152. The foregoing character input can thus be performed by using six of the keys on the full keyboard. For the sake of arbitrary assignment of the six keys, it is preferable that the mapping between the character codes from the full keyboard and the key codes to be used by the control unit 152 be changeable. When the key entry unit 158 accepts an unmapped character code, it makes no output to the control unit 152. The key entry unit 158 may issue a warning sound or onscreen display to notify the user of the input error.

Figure 8A:
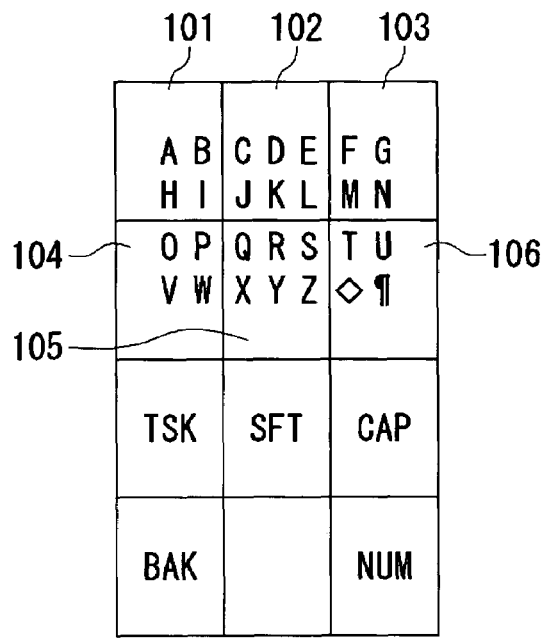
FIG. 8A is a diagram showing an example where character codes are assigned to a group of keys in four rows and three columns, which is a part of a full keyboard or a numeric keypad.
Figure 8B:
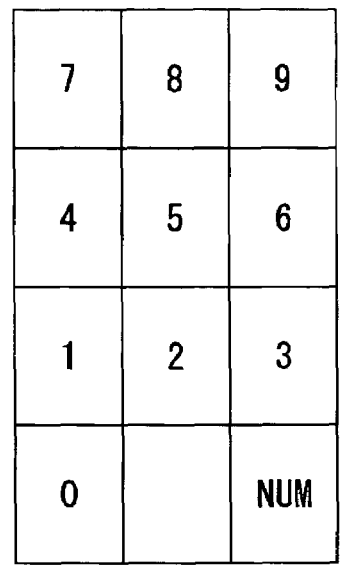
FIG. 8B is a diagram showing the state where the key layout is switched to that of an ordinary numeric keypad.

FIG. 8A is a diagram showing an example where character codes are assigned to a group of keys in four rows and three columns, which is a part of a full keyboard, a numeric keypad, or the like. The keyboard 100 described in conjunction with FIG. 1A is arranged over the upper part of the four-row three-column key group. The lower part is allocated for frequently-used keys such as "TSK," "SFT," "CAP," "BAK," and "NUM" for single-stroke entry. When frequently-used keys are thus provided aside from the six keys for entering essential characters, it is possible to reduce the number of key strokes for higher input efficiency. Here, "SFT" represents a "Shift" key, which shifts the next entry of a single alphabetical character to an uppercase or a lowercase. The "CAP" represents a "Caps Lock" key, which toggles between on and off upon each depression. The "BAK" represents a "Back Space" key, and the "NUM" a "Num Lock" key. The "Num Lock" key is turned on to switch the numeric keypad area of the full keyboard into the layout of FIG. 8A, and turned off to switch it into the normal layout of the numeric keypad of FIG. 8B.

In this example, a "Ctrl" key to be used to enter hidden control codes may be configured to act on a single character that follows the input of, e.g., "TSK+ct." More specifically, in this example, "^a" (Ctrl+a) can be entered as "TSK+ct+A," or by pressing the sixth key 106, the fourth key 104, the second key 102, the first key 101, the sixth key 106, the second key 102, the first key 101, and the first key 101 in order. For mouse cooperation, two successive depressions of the "Ctrl" key can switch on/off the mouse.

Figure 9:
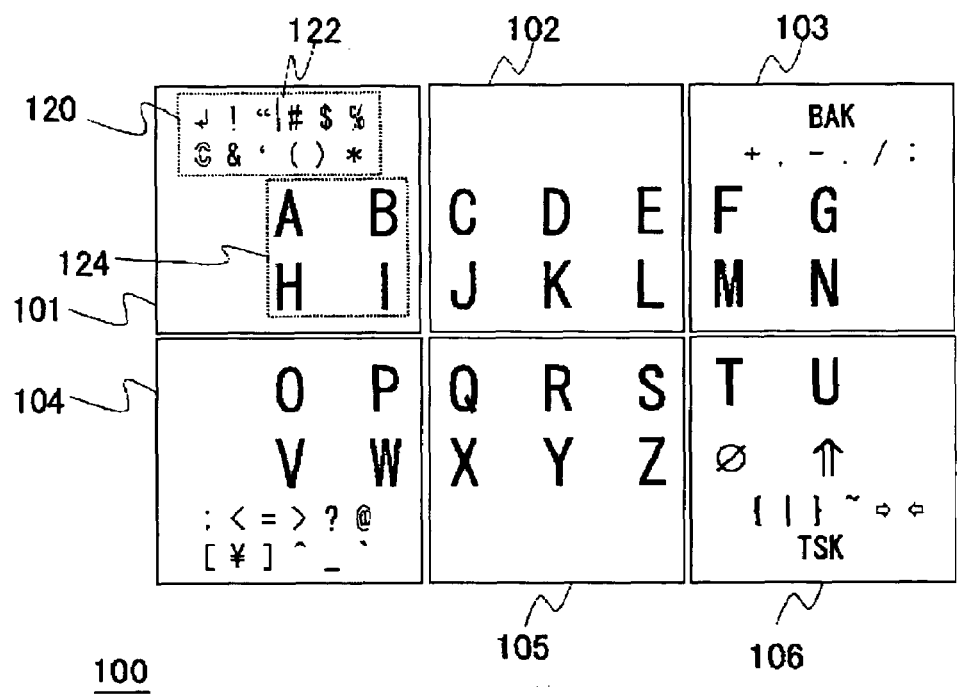
FIG. 9 is a diagram showing the key top of another keyboard according to the embodiment.

The legends on the key top are arbitrary, and may be changed to various forms depending on such factors as the language to input. FIG. 9 is a diagram showing another example of the key top. Aside from alphabetical characters, this key top includes legends of some special characters as groups of sub characters 120. For example, the first key 101 has the legends of '(enter), !, ", #, $, and %' and "(Caps), &, ', (, ), and *" above a group of main characters 124 of "A, B, H, and I." This group of sub characters 120 can be entered through the use of extended keys. These characters are entered by the key sequences of "case 1" and "case 2" in FIG. 6. The groups of sub characters 120 are shown distinct from the legends of the groups of main characters 124 for the sake of user recognition. For example, the groups of sub characters 120 may be shown in a size smaller than the groups of main characters 124 are, or shown in a font weaker than the groups of main characters 124 are. Besides, the groups of sub characters 120 are shown in positions not to interfere the visibility of the groups of main characters 124, such as above, below, on the right, and on the left of the groups of main characters 124.

A delimiter 122 is shown between the third and fourth characters from the left so that the user can easily see the characters to be assigned to the respective keys after a group of sub characters 120 is selected. More specifically, in FIG. 9, '(enter), !, and "' are assigned to the first key 101, the second key 102, and the third key 103, respectively. "#, $, and %" are assigned to the fourth key 104, the fifth key 105, and the sixth key 106, respectively. The delimiter 122 may have any shape, or may be other than "|" in another example. In still another example, the delimiter 122 need not be shown.

FIGS. 10 and 11 are charts for showing the key sequences for entering special characters and special keys, respectively. For example, "!" is entered by the key sequence of "TSK+ ex." That is, "!" can be entered by pressing the sixth key 106, the fourth key 104, the second key 102, the third key 103, the fifth key 105, and the sixth key 106 in order. The key sequences for entering these special characters and special keys are defined so as not to overlap one another, and are stored in the storing unit 156 of FIG. 3. The key sequences of those characters are formed by combining the shortened names of the respective characters, such as leading parts of the names or abbreviations, with "TSK." For example, the key sequence for "!," or an exclamation mark, is "TSK" followed by the leading two characters "ex." This facilitates the user to remember the key sequences of the respective characters. By the key sequences described above, the alphabetical characters, special characters, and special keys can be all entered with the six keys.

According to the keyboard described in the present embodiment, the user can operate the keys within the range of movement of the fingers of one hand with the wrist fixed roughly. The keyboard can thus be used as an input device for handicapped people who can only move finger tips, for example. Since the number of keys in use is six, the keys can be increased in size without much increasing the size of the entire keyboard. For example, each single key may be sized to around 20 cm×20 cm to constitute a keyboard for foot operation, as well as keyboards to be operated with the head, the jaw, a mouth-held pen, etc. The key sizes can be adjusted appropriate according to the characteristics of the body parts to be used for input. It is understood that the keys need not have an uniform size. The keyboard may be made of keys of different sizes. As above, the reduced number of keys allows free size settings of each key, providing flexibility in keyboard design.

Up to this point, the present invention has been described in conjunction with the embodiment thereof. The embodiment has been given solely by way of illustration. It will be understood by those skilled in the art that various modifications may be made to combinations of the foregoing components and processes, and all such modifications are also intended to fall within the scope of the present invention.

According to the present invention, it is possible to enter characters effectively with a keyboard having fewer keys.

What is claimed is:

1. An input device comprising:
   six keys arranged in two rows and three columns;
   a control unit which outputs, when keys included in the six keys are pressed in succession according to a pressing sequence comprising multiple keystrokes, character codes depending on the number of keystrokes and the sequence,
   wherein the control unit:
   outputs a character code in a set of two-stroke character codes, when a first keystroke is entered by pressing one of the keys and then a second keystroke is entered by pressing the same key or an adjacent key; and
   outputs, when the key pressed in the second keystroke is not adjacent to the key pressed in the first keystroke, a character code in a set of three-stroke character codes depending on a key pressed in a third keystroke.

2. The input device according to claim 1, wherein
   if the keys pressed in the first keystroke and the second keystroke are of a predefined combination, the control unit does not output a character code in response to the second keystroke, and outputs a character code in a set of multiple-stroke character codes depending on a combination of the keys pressed in the first keystroke and the second keystroke with keys pressed in the third and subsequent keystrokes.

3. The input device according to claim 2, further comprising:
   a special key pressed for the purpose of omitting a part of a pressing sequence comprising multiple keystrokes of at least one of the six keys, wherein if the special key is pressed in the first keystroke,
   the control unit outputs a character code in the set of the two-stroke character codes or in a set of multiple-stroke character codes depending on which of the six keys is pressed in the second and subsequent keystrokes.

4. The input device according to claim 2, wherein
   the character codes in the set of two-stroke character codes represent alphabetical characters and the character codes in the set of three-stroke character codes represent numeric characters or special characters.

5. The input device according to claim 2, wherein
   any of the six keys may have legends of the character codes under a predetermined rule.

6. The input device according to claim 5, wherein
   the predetermined rule is a replication of a layout of the six keys.

7. A computer readable medium which stores a computer program product comprising the following modules, which, when executed by a computer, cause the computer to perform the function:
   a detecting module which detects which one of six keys arranged in two rows and three columns is pressed;
   a first output module which outputs a character code in a set of two-stroke character codes, when a first keystroke is entered by pressing one of the keys and then a second keystroke is entered by pressing the same key or an adjacent key;
   a second output module which outputs, when the key pressed in the second keystroke is not adjacent to the key pressed in the first keystroke, a character code in a set of three-stroke character codes depending on a key pressed in a third keystroke.

8. A method for data entry comprising:
   detecting a first key press and which one of six keys arranged in two rows and three columns is pressed, wherein the key of the first key press is referred to as a first key;
   detecting a second key press within a predetermined time and which one of said six keys is pressed, wherein the key of the second key press is referred to as a second key; and
   determining if the second key is adjacent to the first key and based on the result selectively:
   outputing a character code from a set of two-stroke character codes when the first key and the second key are the same key or adjacent keys; or
   when the second key is not the same as or adjacent to the first key, detecting a third key press and which of said six keys is pressed, referred to as a third key, and based on said third key, outputting a character code in a set of three-stroke character codes.

* * * * *

UNITED STATES PATENT AND TRADEMARK OFFICE
CERTIFICATE OF CORRECTION

| | |
|---|---|
| PATENT NO. | : 7,230,607 B2 |
| APPLICATION NO. | : 11/008673 |
| DATED | : June 12, 2007 |
| INVENTOR(S) | : Katsuyasu Ono |

It is certified that error appears in the above-identified patent and that said Letters Patent is hereby corrected as shown below:

On the title page, insert the following text:

--Related U.S. Application Data
(63) Continuation of Application No. PCT/JP03/07482 field on June 12, 2003.--

At column 1, line 4, insert the following text:

--This application is a continuation of Application No. PCT/JP03/07482 filed June 12, 2003.--

Signed and Sealed this

Twenty-seventh Day of October, 2009

David J. Kappos
*Director of the United States Patent and Trademark Office*